US009001518B2

(12) United States Patent
    Hauenstein

(10) Patent No.: US 9,001,518 B2
(45) Date of Patent: Apr. 7, 2015

(54) POWER MODULE WITH PRESS-FIT CLAMPS

(75) Inventor: Henning M. Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 482 days.

(21) Appl. No.: 13/094,695

(22) Filed: Apr. 26, 2011

(65) Prior Publication Data

US 2012/0275121 A1    Nov. 1, 2012

(51) Int. Cl.
| | |
|---|---|
| H05K 7/00 | (2006.01) |
| H01L 25/07 | (2006.01) |
| H01L 23/00 | (2006.01) |
| H01L 23/48 | (2006.01) |
| H01R 12/72 | (2011.01) |
| H01R 12/77 | (2011.01) |
| H01L 25/18 | (2006.01) |
| H05K 1/11 | (2006.01) |

(52) U.S. Cl.
CPC .............. *H01L 25/072* (2013.01); *H01L 24/72* (2013.01); *H01L 23/48* (2013.01); *H01R 12/721* (2013.01); *H01R 12/778* (2013.01); *H01L 25/18* (2013.01); *H01L 2924/13091* (2013.01); *H01L 2924/13055* (2013.01); *H05K 2201/10386* (2013.01); *H05K 1/117* (2013.01)

(58) Field of Classification Search
CPC ........... H05K 1/11; H05K 1/111; H05K 1/18; H05K 1/0201; H05K 1/0243; H05K 1/16; H05K 1/188; H05K 3/325; H05K 3/308; H05K 7/1069; H05K 7/12

USPC .......................... 361/760, 111, 119, 809, 824
See application file for complete search history.

(56) References Cited

U.S. PATENT DOCUMENTS

| | | | | |
|---|---|---|---|---|
| 4,579,406 | A | * | 4/1986 | Laursen et al. .................. 439/62 |
| 4,899,251 | A | * | 2/1990 | Imai et al. ..................... 361/627 |
| 4,991,666 | A | | 2/1991 | Septfons |
| 7,554,188 | B2 | | 6/2009 | Hauenstein |
| 7,619,302 | B2 | | 11/2009 | Hauenstein |
| 2003/0173111 | A1 | * | 9/2003 | Frutschy et al. ............... 174/260 |
| 2007/0138651 | A1 | | 6/2007 | Hauenstein |
| 2007/0290311 | A1 | | 12/2007 | Hauenstein |
| 2011/0170259 | A1 | * | 7/2011 | Miller et al. .................. 361/689 |
| 2011/0188279 | A1 | * | 8/2011 | Aiba et al. .................... 363/141 |
| 2011/0235377 | A1 | * | 9/2011 | Schreiber ....................... 363/71 |

FOREIGN PATENT DOCUMENTS

| | | |
|---|---|---|
| DE | 10 2004 036 982 | 3/2006 |
| GB | 1 369 995 | 10/1974 |

\* cited by examiner

*Primary Examiner* — Tremesha S Willis
(74) *Attorney, Agent, or Firm* — Farjami & Farjami LLP

(57) ABSTRACT

According to an exemplary embodiment, a bondwireless power module residing on a top surface of a substrate includes at least one input power pad providing power to the module and at least one output current pad providing output current from the module. At least one press-fit input power clamp engages a top side of the at least one input power pad, and engages a bottom surface of the substrate. Also, at least one press-fit output current clamp engages a top side of the at least one output current pad, and engages the bottom surface of the substrate. The at least one press-fit input power clamp can include at least one top prong and at least one bottom prong. Furthermore, the at least one bottom prong can press the input power pad into the at least one top prong.

20 Claims, 4 Drawing Sheets

POWER MODULE WITH PRESS-FIT CLAMPS

BACKGROUND OF THE INVENTION

1. Field of the Invention

The present invention is generally in the field of circuits and electrical modules. More particularly, the invention relates to electrical contacts for power modules.

2. Background Art

A contact for a power module may be exposed to significant stress, which can compromise the integrity of both the mechanical and electrical connection with the contact. The contact should be capable of withstanding harsh operating conditions, which often accompany the power module. For example, the power module may generate heat, which can reach the contact and the contact must often carry high current for the power module resulting in a high temperature in the contact. The high temperature is often accompanied by thermal cycling, compounding stresses imposed upon the contact. Furthermore, the power module may be deployed in an environment that introduces mechanical stress on the connection between the contact and the power module.

By way of example, the contact may conventionally comprise a bond wire or a lead affixed to a contact pad. The power module may be, for example, a motor drive inverter for a motor in a hybrid vehicle. The motor drive inverter may generate heat, which can reach the contact and the contact may carry high current for the motor drive inverter resulting in a high temperature in the contact. Furthermore, the motor drive inverter will frequently vacillate between periods of use and disuse, thereby exposing the contact to thermal cycling. Also, body rattle of the hybrid vehicle may cause mechanical stress on the connection of the contact. As such, conventionally there is a substantial risk of the contact failing due to, for example, bond wire lift off or solder wear out.

Thus, there is a need in the art for the capability to provide a power module with a contact while overcoming the drawbacks and deficiencies in the art.

SUMMARY OF THE INVENTION

A power module with press-fit clamps, substantially as shown in and/or described in connection with at least one of the figures, and as set forth more completely in the claims.

DETAILED DESCRIPTION OF THE INVENTION

The present invention is directed to a power module with press-fit clamps. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
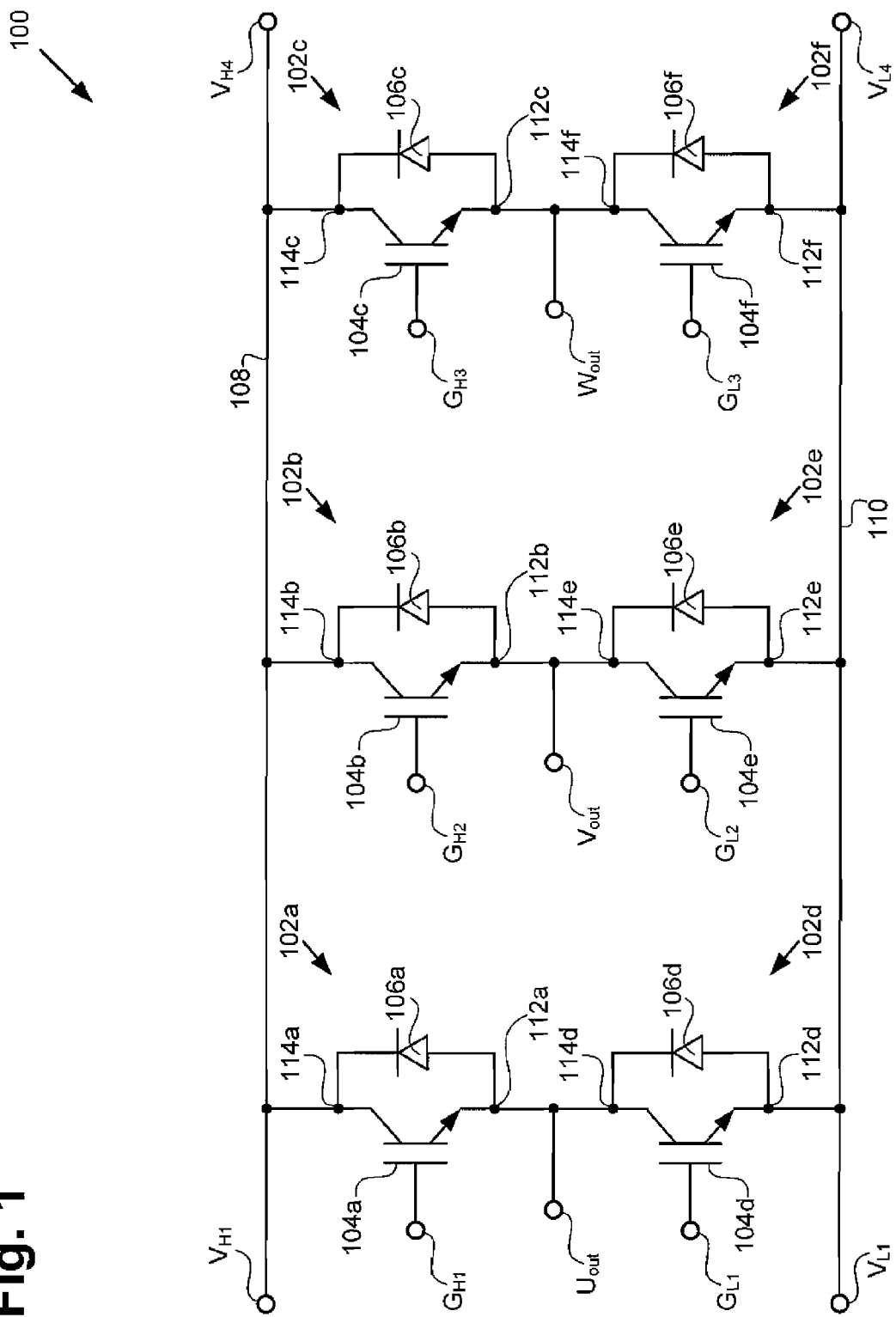
FIG. 1 shows an exemplary schematic of a motor drive inverter, in accordance with an embodiment of the present invention.

FIG. 1 shows an exemplary schematic of motor drive inverter 100 (also referred to as a three-phase inverter or a three-phase motor drive inverter) in accordance with an embodiment of the present invention. As it will become apparent by the description of the present exemplary embodiment, it is important to note that the concepts of the present invention apply to various power modules which require high current contacts with electrical and mechanical reliability and the ability to withstand high temperatures and temperature cycling; and that such various power modules are not limited to a motor drive inverter which is used only as a specific example to illustrate an embodiment of the present invention.

Motor drive inverter 100 may be implemented in a bond-wireless power module with a press-fit clamp, although other circuits can be implemented in other embodiments of the present invention. Motor drive inverter 100 comprises high side devices 102a, 102b, and 102c and low side devices 102d, 102e, and 102f, which are also referred to herein as devices, such as devices 102a-102f.

In the present embodiment, each of devices 102a-102f is a power switch including a freewheeling diode connected in parallel with a corresponding insulated-gated bipolar transistor (IGBT). For example, high side device 102a includes IGBT 104a and diode 106a, high side device 102b includes IGBT 104b and diode 106b, high side device 102c includes IGBT 104c and diode 106c, low side device 102d includes IGBT 104d and diode 106d, low side device 102e includes IGBT 104e and diode 106e, and low side device 102f includes IGBT 104f and diode 106f. Although devices 102a-102f each include an IGBT as a power switch, in some embodiments each of devices 102a-102f can include a different device, such as a metal-oxide-semiconductor field-effect transistor (MOSFET). For example, in some embodiments a MOSFET replaces IGBT 104a and diode 106b can be a body diode of the MOSFET. Furthermore, in some embodiments devices 102a-102f may not include diodes 106a-106f or may include electrical components other than diodes 106a-106f. Also, in some embodiments devices 102a-102f are devices other than power switches.

Motor drive inverter 100 includes high side power bus 108 and low side power bus 110. High side power bus 108 includes high side input power terminals $V_{H1}$ and $V_{H4}$ for connecting a high side supply voltage across high side power bus 108 to provide power to motor drive inverter 100. Low side power bus 110 includes low side input power terminals $V_{L1}$ and $V_{L4}$ for connecting a low side supply voltage across low side power bus 110 to provide power to motor drive inverter 100. Any combination of positive, negative, or ground voltages can be connected to input power terminals $V_{H1}$, $V_{H4}$, $V_{L1}$ and $V_{L4}$ in various embodiments of the present invention.

In the present example, motor drive inverter 100 is a three-phase inverter, or more generally a polyphase inverter, which can be used to drive a motor (not shown in FIG. 1). In FIG. 1, a U phase of motor drive inverter 100 includes devices 102a and 102d connected in a half-bridge between high side power bus 108 and low side power bus 110 with output current terminal $U_{out}$ connected between devices 102a and 102d. Similarly, a V phase of motor drive inverter 100 includes devices 102b and 102e connected in a half-bridge between high side power bus 108 and low side power bus 110 with output current terminal $V_{out}$ connected between devices 102b and 102e. Also, a W phase of motor drive inverter 100 includes devices 102c and 102f connected in a half-bridge between high side power bus 108 and low side power bus 110 with output current terminal $W_{out}$ connected between devices 102c and 102f.

Motor drive inverter 100 also includes high side gate terminals $G_{H1}$, $G_{H2}$, and $G_{H3}$ and low side gate terminals $G_{L1}$, $G_{L2}$, and $G_{L3}$ (also referred to herein as gate terminals $G_{H1}$, $G_{H2}$, $G_{H3}$, $G_{L1}$, $G_{L2}$, and $G_{L3}$), which are each connected to a corresponding gate of one of IGBTs 104a-104f, as shown in FIG. 1. Gate terminals $G_{H1}$, $G_{H2}$, $G_{H3}$, $G_{L1}$, $G_{L2}$, and $G_{L3}$ can be used to selectively enable and disable IGBTs 104a-104f, as is known in the art.

FIG. 1 shows collector/cathode nodes 114a, 114b, 114c, 114d, 114e, and 114f and emitter/anode nodes 112a, 112b, 112c, 112d, 112e, and 112f. Collector/cathode nodes 114a, 114b, and 114c are each connected to high side power bus 108 and emitter/anode nodes 112d, 112e, and 112f are each connected to low side power bus 110. Also shown in FIG. 1, emitter/anode node 112a is connected to collector/cathode node 114d, emitter/anode node 112b is connected to collector/cathode node 114e, and emitter/anode node 112c is connected to collector/cathode node 114f.

Thus, as described above, motor drive inverter 100 has input power terminals $V_{H1}$, $V_{H4}$, $V_{L1}$ and $V_{L4}$ and output current terminals $U_{out}$, $V_{out}$, $W_{out}$, which can support high current and high power. Motor drive inverter 100 can be, for example, a motor drive inverter for a motor in a hybrid vehicle. Thus, the motor drive inverter may generate heat, which can reach input power terminals $V_{H1}$, $V_{H4}$, $V_{L1}$ and $V_{L4}$ and output current terminals $U_{out}$, $V_{out}$, $W_{out}$. As such, contacts to input power terminals $V_{H1}$, $V_{H4}$, $V_{L1}$ and $V_{L4}$ and output current terminals $U_{out}$, $V_{out}$, $W_{out}$ can reach high temperatures. Furthermore, the motor drive inverter will frequently vacillate between periods of use and disuse, thereby exposing the contacts to thermal cycling. Also, body rattle of the hybrid vehicle may cause mechanical stress on the connection of the contacts.

The contacts may conventionally comprise bond wires or leads that can be affixed respectively to input power terminals $V_{H1}$, $V_{H4}$, $V_{L1}$, and $V_{L4}$ and output current terminals $U_{out}$, $V_{out}$, and $W_{out}$. As such, conventionally there is a substantial risk of the contacts failing due to, for example, bond wire lift off or solder wear out. Embodiments of the present invention can provide for press-fit clamps, which can withstand the harsh operating conditions, such as those described above. It will be appreciated that although in the present example the invention is described in relation to a motor drive inverter; in other embodiments, circuits and modules other than a motor drive inverter can benefit from the present invention as discussed below.

Figure 2:
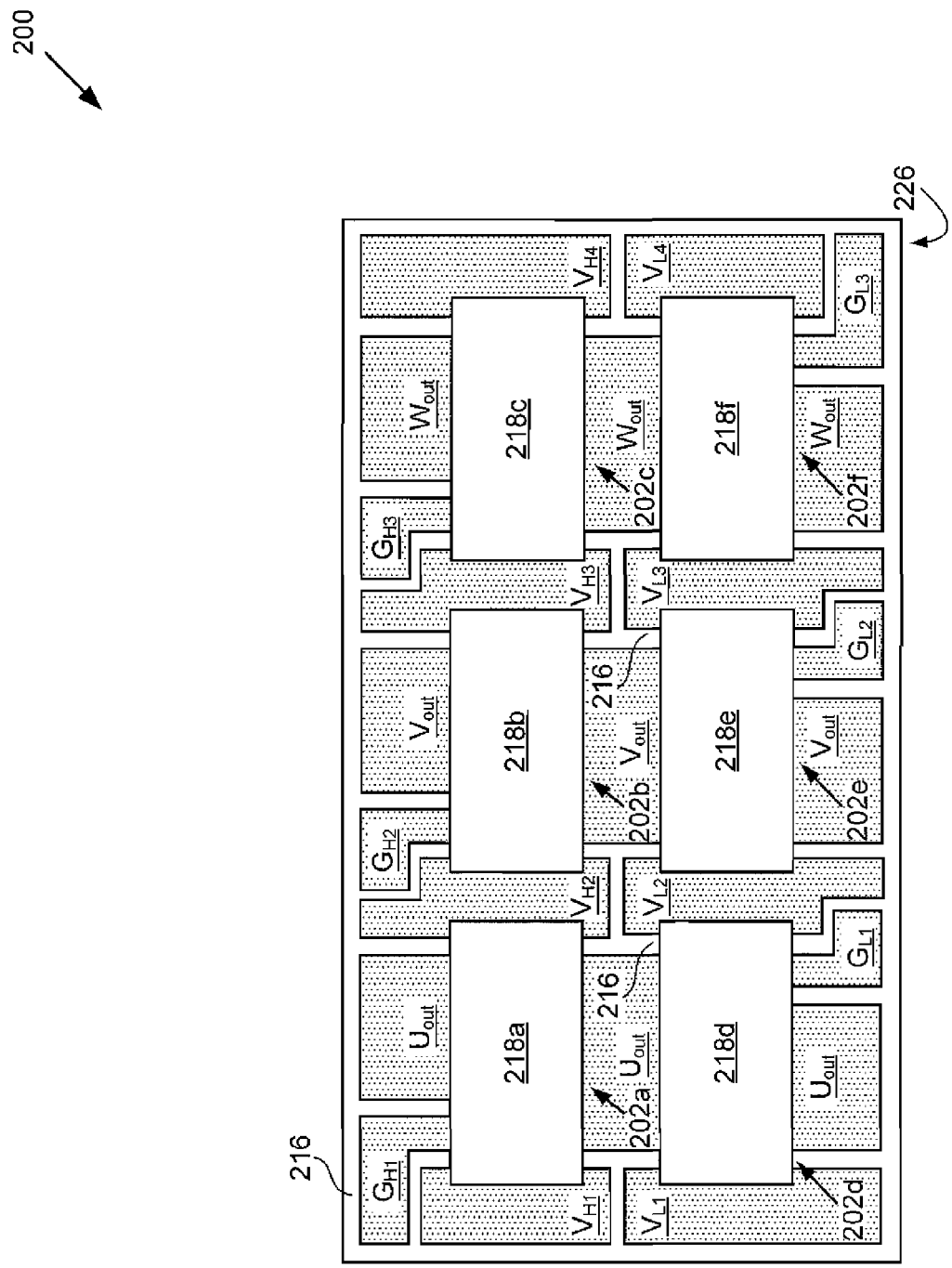
FIG. 2 shows a top view of a bondwireless power module residing on a top surface of a substrate prior to connection with at least one press-fit clamp, in accordance with an embodiment of the present invention.

Referring now to FIG. 2, FIG. 2 shows a top view of bondwireless power module 200 (also referred to herein as "three-phase inverter module," "motor drive inverter module," and "power module") residing on substrate 216 prior to connection with at least one press-fit clamp, in accordance with an embodiment of the present invention. Bondwireless power module 200 can correspond to motor drive inverter 100 in FIG. 1. FIG. 2 shows high side conductive clips 218a, 218b, 218c (also referred to herein as "conductive clips 218" and "high side conductive clips 218") and low side conductive clips 218d, 218e, and 218f (also referred to herein as "conductive clips 218" and "low side conductive clips 218"), high side gate pads $G_{H1}$, $G_{H2}$, $G_{H3}$ (also referred to herein as "gate pads G" and "high side gate pads G") and low side gate pads $G_{L1}$, $G_{L2}$, and $G_{L3}$ (also referred to herein as "gate pads G" and "low side gate pads G"), high side power pads $V_{H1}$, $V_{H2}$, $V_{H3}$, $V_{H4}$ (also referred to herein as "power pads V" and "high side power pads V") and low side power pads $V_{L1}$, $V_{L2}$, $V_{L3}$, and $V_{L4}$ (also referred to herein as "power pads V" and "low side power pads V") and output current pads $U_{out}$, $V_{out}$, and $W_{out}$ all over substrate 216.

In FIG. 2, substrate 216 can comprise for example, insulating material, such as ceramic, epoxy resin, and other substrate materials. Gate pads G, power pads V, and output current pads $U_{out}$, $V_{out}$, and $W_{out}$ are over substrate 216 and comprise conductive material, such as copper. In some embodiments substrate 216 can comprise a direct bonded copper (DBC) substrate. For example, substrate 216 can comprise ceramic having copper gate pads G, power pads V, and output current pads $U_{out}$, $V_{out}$, and $W_{out}$ bonded to the surface thereof. Thus, gate pads G, power pads V, and output current pads $U_{out}$, $V_{out}$, and $W_{out}$ can comprise conductive traces of substrate 216. It is noted that output current pads $U_{out}$, $V_{out}$, and $W_{out}$ are each a single continuous pad in the present embodiment. Also, in some embodiments substrate 216 can include a conductive material on bottom surface 226 thereof, which is not shown in FIG. 2. For example, the conductive material can be a copper layer bonded to ceramic. Thus, in some embodiments bottom surface 226 of substrate 216 can comprise dielectric material and in other embodiments bottom surface 226 can comprise conductive material.

Also in FIG. 2, conductive clips 218 comprise conductive material and are over respective gate pads G, power pads V, and output current pads $U_{out}$, $V_{out}$, and $W_{out}$. For example, conductive clips 218 can be copper, or other metals or metal alloys. Conductive clips 218 include a top surface (shown in FIG. 2) and opposing legs (not shown in FIG. 2) connected to the top surface. One of the opposing legs is electrically connecting the top surface to one of power pads V and the other of the opposing legs is electrically connecting the top surface to another of power pads V. For example the opposing legs of conductive clip 218a are respectively electrically connected to high side power pads $V_{H1}$ and $V_{H2}$ in regions where conductive clip 218a overlaps power pads $V_{H1}$ and $V_{H2}$ in FIG. 2.

It is noted that in the present embodiment conductive clips 218 are not electrically connected to output current pads $U_{out}$, $V_{out}$, and $W_{out}$ and gate pads G. Rather, for example, high side conductive clips 218 and high side power pads V form a current path between high side power pads $V_{H1}$ and $V_{H4}$ such that current can traverse through high side conductive clips 218 over output current pads $U_{out}$, $V_{out}$, and $W_{out}$ and high side gate pads G. Thus, high side power pads $V_{H1}$ and $V_{H4}$ in FIG. 2 can correspond respectively to high side input power terminals $V_{H1}$ and $V_{H4}$ in FIG. 1 and may be referred to as high side input power pads $V_{H1}$ and $V_{H4}$ or simply input power pads $V_{H1}$ and $V_{H4}$. As such, a high side power bus corresponding to high side power bus 108 in FIG. 1 is formed between input power pads $V_{H1}$ and $V_{H4}$.

Similarly, low side conductive clips 218 and low side power pads V form a current path between low side power pads $V_{L1}$ and $V_{L4}$ such that current can traverse through low side conductive clips 218 over output current pads $U_{out}$, $V_{out}$, and $W_{out}$ and low side gate pads G. Thus, low side power pads $V_{L4}$ and $V_{L4}$ in FIG. 2 can correspond respectively to low side input power terminals $V_{L4}$ and $V_{L4}$ in FIG. 1 and may be referred to as low side input power pads $V_{L1}$ and $V_{L4}$ or simply input power pads $V_{L1}$ and $V_{L4}$. As such, a low side power bus corresponding to low side power bus 110 in FIG. 1 is formed between input power pads $V_{L1}$ and $V_{L4}$.

In the present embodiment, high side devices 202a, 202b, and 202c correspond respectively to high side devices 102a, 102b, and 102c in FIG. 1. Also, low side devices 202a, 202b, and 202c correspond respectively to low side devices 102d, 102e, and 102f in FIG. 1. Thus, high side devices 202a, 202b, and 202c and low side devices 202d, 202e, and 202f each comprise a freewheeling diode connected in parallel with a corresponding IGBT. The freewheeling diode and the IGBT are not shown in FIG. 2, but can be included under the top surface of a respective conductive clip 218 between the opposing legs discussed above.

In bondwireless power module 200, high side conductive clips 218a, 218b, and 218c are electrically connected to respective nodes corresponding respectively to collector/cathode nodes 114a, 114b, and 114c in FIG. 1. Low side conductive clips 218d, 218e, and 218f are electrically connected to respective nodes corresponding respectively to emitter/anode nodes 112d, 112e, and 112f in FIG. 1.

Also in the present embodiment, output current pad $U_{out}$ is coupling an emitter/anode node of high side device 202a, corresponding to emitter/anode node 112a in FIG. 1, to a collector/cathode node of low side device 202d, corresponding to collector/cathode node 114d in FIG. 1. Output current pad $V_{out}$ is coupling an emitter/anode node of high side device 202b, corresponding to emitter/anode node 112b in FIG. 1, to a collector/cathode node of low side device 202e, corresponding to collector/cathode node 114e in FIG. 1. Also, output current pad $W_{out}$ is coupling an emitter/anode node of high side device 202c, corresponding to emitter/anode node 112c in FIG. 1, to a collector/cathode node of low side device 202f, corresponding to collector/cathode node 114f in FIG. 1. Thus, output current pads $U_{out}$, $V_{out}$ and $W_{out}$ in FIG. 2 correspond respectively to output current terminals $U_{out}$, $V_{out}$, and $W_{out}$ in FIG. 1. As such, output current pads $U_{out}$, $V_{out}$, and $W_{out}$ are each coupled to a high side device and a low side device where the high and low side devices are connected in a half-bridge, as described above with respect to FIG. 1.

In power module 200, gate pads $G_{H1}$, $G_{H2}$, $G_{H3}$, $G_{L1}$, $G_{L2}$, and $G_{L3}$ correspond respectively to gate terminals $G_{H1}$, $G_{H2}$, $G_{H3}$, $G_{L1}$, $G_{L2}$, and $G_{L3}$ in FIG. 1 and are each electrically connected to a gate of a corresponding IGBT under a respective conductive clip 218.

Thus, as described above, power module 200 comprises a U-phase, a V-phase, and a W-phase of a three-phase inverter. Power module 200 comprises input power pads $V_{H1}$, $V_{H4}$, $V_{L1}$, and $V_{L4}$ and output current pads $U_{out}$, $V_{out}$, and $W_{out}$. Power module 200 may also include a respective contact electrically and mechanically connected to each of input power pads $V_{H1}$, $V_{H4}$, $V_{L1}$, and $V_{L4}$ and output current pads $U_{out}$, $V_{out}$, and $W_{out}$ to allow for connection of power module 200 to external circuits (not show in FIG. 2).

In the present example, power module 200 can be a motor drive inverter for a motor in a hybrid vehicle. Thus, motor drive inverter module 200 will generate heat, which will reach the contacts. For example, devices 102 in FIG. 1 can generate heat and furthermore, high current will flow through input power pads $V_{H1}$, $V_{H4}$, $V_{L1}$, and $V_{L4}$ and output current pads $U_{out}$, $V_{out}$, and $W_{out}$ and into the contacts resulting in a high temperature in the contacts. Furthermore, motor drive inverter module 200 will frequently vacillate between periods of use and disuse, thereby exposing the contacts to thermal cycling. Also, body rattle of the hybrid vehicle may cause mechanical stress on the connection with the contacts.

In accordance with various embodiment of the present invention, power module 200 includes at least one press-fit input power clamp as a contact for at least one of input power pads $V_{H1}$, $V_{H4}$, $V_{L1}$, and $V_{H4}$ and at least one press-fit output current clamp as a contact for at least one of output current pads $U_{out}$, $V_{out}$, and $W_{out}$, which are capable of withstanding harsh operating conditions, such as those described above, while maintaining electrical and mechanical connection with power module 200.

Figure 3A:
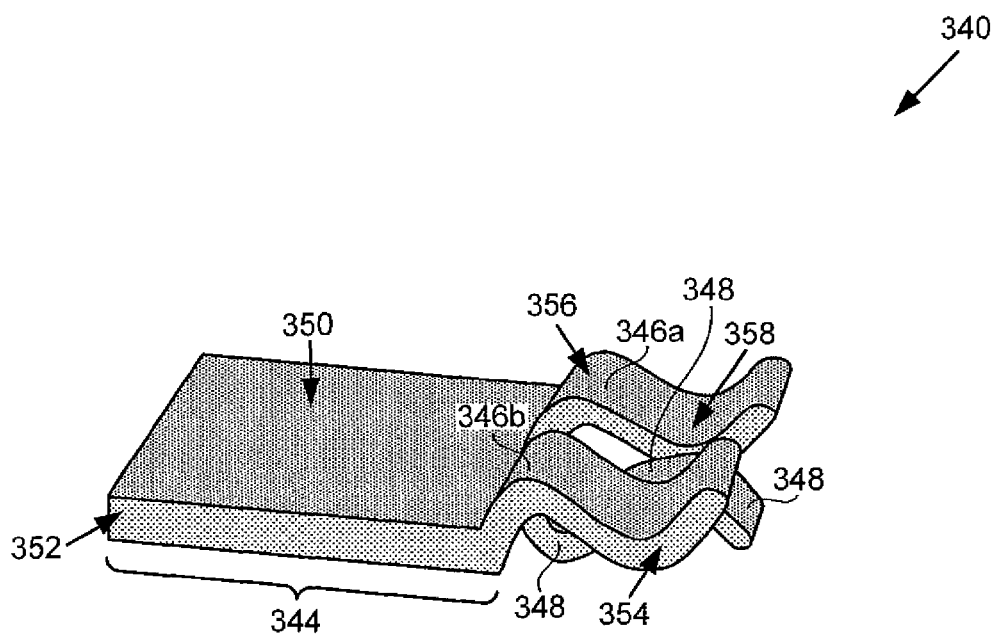
FIG. 3A illustrates a press-fit clamp, in accordance with an embodiment of the present invention.

Referring now to FIG. 3A, FIG. 3A illustrates press-fit clamp 340, in accordance with an embodiment of the present invention. In FIG. 3A, press-fit clamp 340 is in an disengaged configuration and includes at least one top prong and a least one bottom prong. For example, in the present embodiment press-fit clamp 340 includes two top prongs and a bottom prong. Press-fit clamp 340 includes lead portion 344, top prongs 346a and 346b (also referred to herein as "prongs"), and bottom prong 348 (also referred to herein as "prong"). As shown in FIG. 3A, lead portion 344 has top surface 350 and adjoining edge 352. In the present embodiment, edge 352 of lead portion 344 is continuous with edge 354 of prong 346b as shown in FIG. 3A. Similarly an edge of prong 346a is continuous with another edge adjoining top surface 350 of lead portion 344 (not shown in FIG. 3A). Press-fit clamp 340 comprises conductive material and in the present embodiment is copper. In some embodiments, press-fit clamp 340 can be constructed by lead forming out of a copper block.

In press-fit clamp 340, each of prongs 346a, 346b, and 348 include at least one downward bend and at least one upward bend. For example, prong 346a has downward bend 356 and upward bend 358. Prongs 346a and 346b, each have a downward bend opposing an upward bend in prong 348 and an upward bend opposing a downward bend in prong 348, as shown in FIG. 3A. In the present embodiment, the upward bends of prongs 346a and 346b (e.g. bend 358) are configured to engage a top side of at least one input power pad, and the downward bend of prong 348 is configured to configured to engage a bottom surface of a substrate. In some embodiments prongs 346a, 346b, and 348 can have more or less upward or downward bends than shown in FIG. 3A, including no upward or downward bends.

Figure 3B:
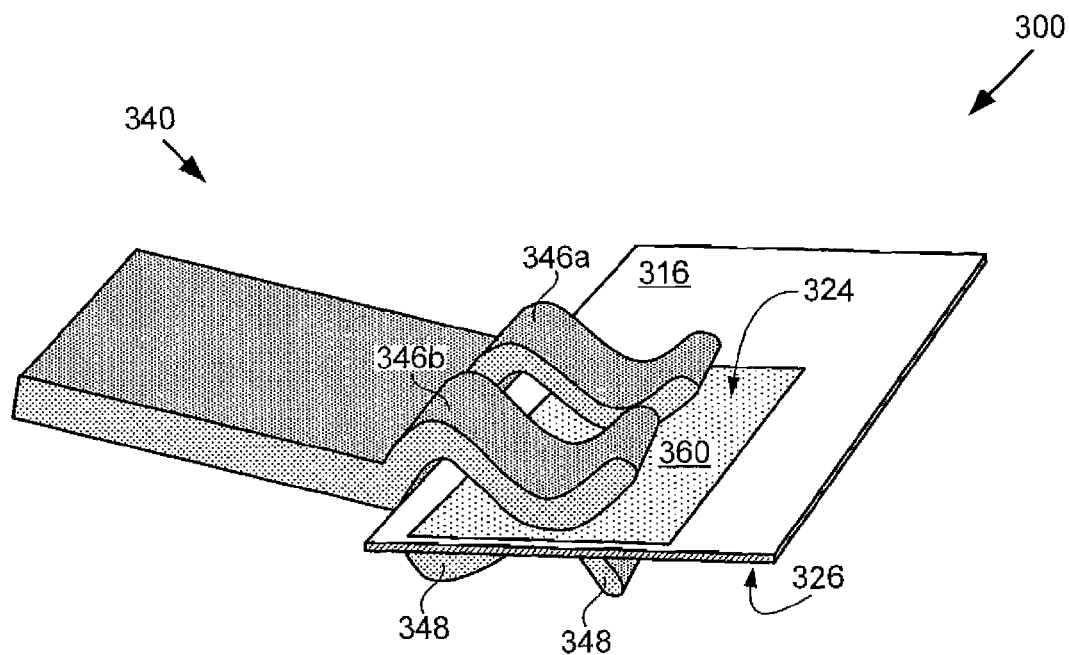
FIG. 3B illustrates a structure including a press-fit clamp engaging a contact pad and a substrate, in accordance with an embodiment of the present invention.

Referring now to FIG. 3B, FIG. 3B illustrates structure 300 including press-fit clamp 340 engaging contact pad 360 and substrate 316, in accordance with an embodiment of the present invention. Substrate 316 corresponds to substrate 216 in FIG. 2 and contact pad 360 corresponds to one of gate pads G, power pads V, and output current pads $U_{out}$, $V_{out}$, and $W_{out}$ in FIG. 2. In FIG. 3B, press-fit clamp 340 is engaging top side 324 of contact pad 360, and engaging bottom surface 326 of substrate 316. More particularly, in the present embodiment, top prongs 346a and 346b are engaging top side 324 of contact pad 360, and bottom prong 348 is engaging bottom surface 326 of substrate 316. Thus, press-fit clamp 340 is engaged, which can be achieved by receiving substrate 316 and contact pad 360 between top prongs 346a and 346b and bottom prong 348, thereby displacing bottom prong 348 below top prongs 346a and 346b from the disengaged position shown in FIG. 3A. Thus, bottom prong 348 is pressing contact pad 360 into top prongs 346a and 346b to apply a clamping force to contact pad 360 and substrate 316.

In some embodiments bottom surface 326 of substrate 316 can comprise dielectric material and in other embodiments bottom surface 326 can comprise conductive material. In the present embodiment, bottom surface 326 of substrate 316 comprises dielectric material such that bottom surface 326 is electrically isolated from contact pad 360. In other embodiments, bottom surface 326 can comprise conductive material and can be electrically connected to contact pad 360. As a specific example, substrate 316 can include at least one through via having conductive material electrically connecting contact pad 360 to bottom surface 326 of substrate 316.

Thus, as described above, press-fit clamp 340 is a contact affixed to contact pad 360 using a clamping force applied to contact pad 360 and substrate 316. Press-fit clamp 340 is configured to maintain good electrical and mechanical contact with contact pad 360 by relying primarily on the clamping force as opposed to solder, conducive adhesive, or other connection means. Although the other connection means may be utilized, they are not required in preferred embodiments of the present invention. Thus, press-fit clamp 340 can maintain good electrical and mechanical contact with contact pad 360 even when exposed to significant stress. For example, press-fit clamp 340 can maintain contact with contact pad 360 when carrying high current and when exposed to high temperatures. Furthermore, good contact can be maintained throughout thermal cycling. As an example, prongs 346a, 346b, and 348 can adjust to accommodate thermal expansion of substrate 316 and contact pad 360 and can absorb mechanical stress on the connection, for example, due to body rattle in a hybrid vehicle. As such, the connection between press-fit clamp 340 and contact pad 360 is not prone to failing due to bond wire lift off or solder wear out.

Figure 4:
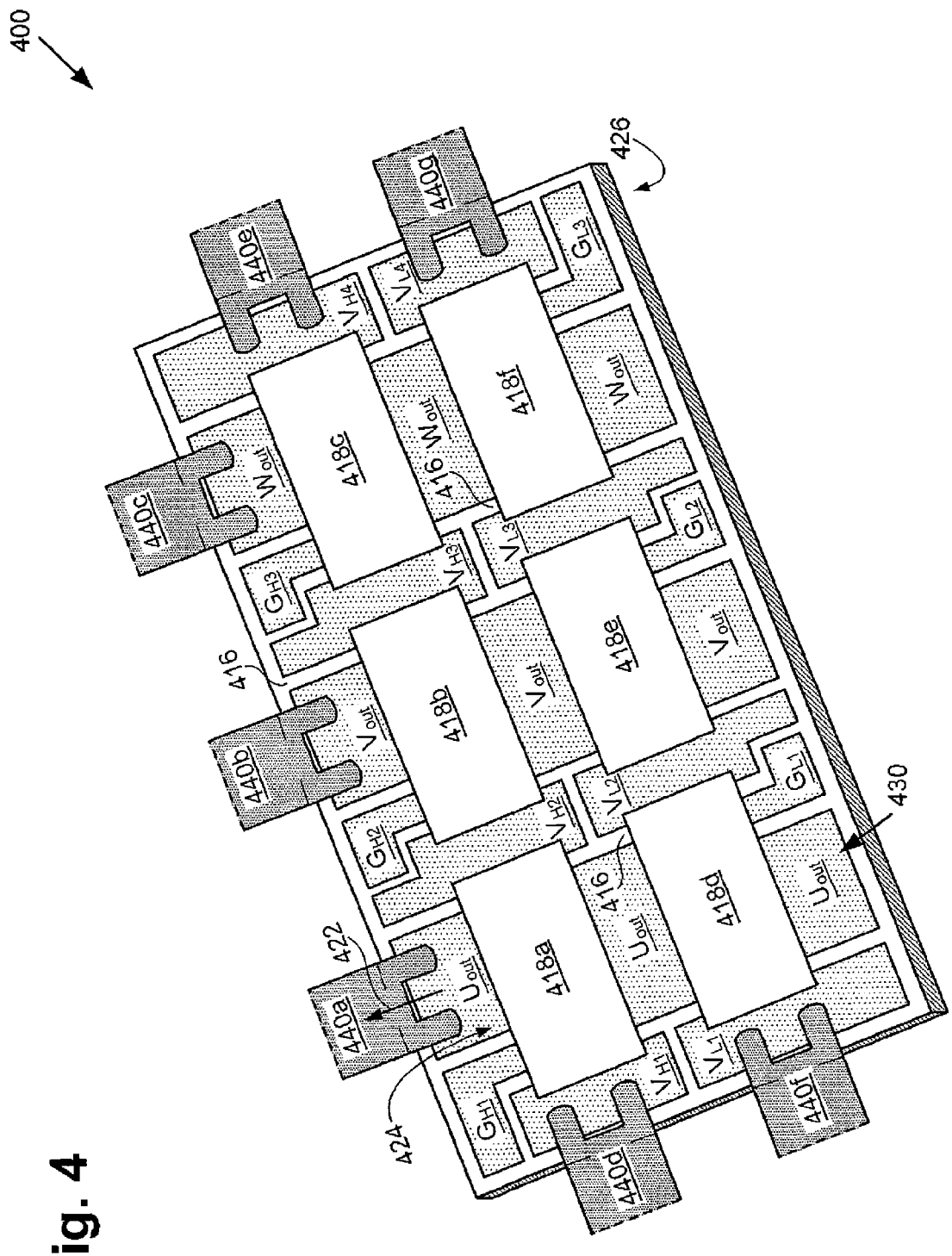
FIG. 4 shows a perspective view illustrating a bondwireless power module with press-fit clamps, in accordance with an embodiment of the present invention.

Now referring to FIG. 4, FIG. 4 shows a perspective view illustrating bondwireless power module 400 with press-fit clamps 440a, 440b, 440c, 440d, 440e, 440f, and 440g (also referred to herein as "press-fit clamps 440"), in accordance with an embodiment of the present invention. Power module 400 corresponds to power module 200 in FIG. 2. Thus, conductive clips 418a, 418b, 418c, 418d, 418e, and 418f correspond respectively to conductive clips 218a, 218b, 218c, 218d, 218e, and 218f in FIG. 2. Also, gate pads G, power pads V, output current pads $U_{out}$, $V_{out}$, and $W_{out}$ and substrate 416 correspond respectively to gate pads G, power pads V, output current pads $U_{out}$, $V_{out}$, and $W_{out}$ and substrate 216 in FIG. 2. Also, each of press-fit clamps 440 corresponds to a press-fit clamp 340 in FIGS. 3A and 3B. As shown in FIG. 4, each of press-fit clamps 440 is engaging a top side of a respective contact pad, and engaging a bottom surface of substrate 416, similar to what has been described with respect to press-fit clamp 340, contact pad 360, and substrate 316 in FIG. 3B. For example, press-fit clamp 440a is engaging top side 424 of output current pad $U_{out}$, and engaging bottom surface 426 of substrate 416 (not shown in FIG. 4).

In some embodiments, at least one of press-fit clamps 440 is engaging a top surface of more than one contact pad. Also, in some embodiments, more than one press-fit clamp is engaging a top surface of the same contact pad. For example, power module 400 can include another press-fit clamp engaging top side 424 on opposing side 430 of output current pad $U_{out}$ and power module 400. Similarly, respective press-fit clamps can engage top surfaces of output current pads $V_{out}$ and $W_{out}$ on opposing sides thereof. It is noted that press-fit clamps can engage a top surface of any combination of pads shown in FIG. 4 similar to what has been described with respect to FIG. 3B and is not limited by the specific embodiment shown in FIG. 4. For example, in some embodiments press-fit clamps may engage a top surface of any of gate pads G. Also, in some embodiments these press-fit clamps are smaller and have lower current carrying capability than press-fit clamps 440. However, in other embodiments bond wires or other connection means may be used instead of or in addition to press-fit clamps to contact any of the contact pads in FIG. 4, such as gate pads G.

In the present embodiment, press-fit clamps 440a, 440b, and 440c are press-fit output current clamps and are respectively engaging a top side of respective output current pads $U_{out}$, $V_{out}$, and $W_{out}$, which can provide output current from power module 400. For example, output current pad $U_{out}$ is providing output current 422 from power module 400, which is a high current received by press-fit clamp 440a. Press-fit clamps 440a, 440b, and 440c are also providing electrical connection to a first external circuit, which is not shown in FIG. 4. In some embodiments the first external circuit can be a motor circuit.

Also in the present embodiment, press-fit clamps 440d, 440e, 440f, and 440g are press-fit input power clamps, and are respectively engaging a top side of respective input power pads $V_{H1}$, $V_{H4}$, $V_{L1}$, and $V_{L4}$. As described above, a high side power bus corresponding to high side power bus 108 in FIG. 1 is formed between input power pads $V_{H1}$ and $V_{H4}$. Thus, the high side power bus is formed between press-fit clamps 440d and 440e. Also described above, a low side power bus corresponding to low side power bus 110 in FIG. 1 is formed between input power pads $V_{L1}$ and $V_{L4}$. Thus, the low side power bus is formed between press-fit clamps 440f and 440g. Press-fit clamps 440d, 440e, 440f, and 440g are also providing electrical connection to a second external circuit, which is not shown in FIG. 4. In some embodiments the second external circuit can be a control circuit or a regulated power supply for power module 400. Thus, press-fit clamps 440 are at respective high power and high current input and output terminals in power module 400. As such, contact can be maintained with power module 400 throughout aforementioned harsh operating conditions.

Thus, as discussed above, in the embodiments of FIGS. 1 through 4, the present invention can provide for a power module, such as a bondwireless three-phase inverter module with press-fit clamps. Various embodiments of the present invention allow for good electrical and mechanical contact between the bondwireless power module and one or more external circuits, which can support high current. The electrical and mechanical contact can be maintained even when exposed to harsh operating conditions. Thus, connection can be made with the bondwireless power module while substantially reducing the risk of contact failure.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A bondwireless power module residing on a top surface of a substrate, said module comprising:
   at least one input power pad providing power to said module;
   at least one output current pad providing output current from said module;

at least one press-fit input power clamp comprising input prongs engaging a top side of said at least one input power pad, and engaging a bottom surface of said substrate, such that said substrate is situated between said input prongs;

at least one press-fit output current clamp engaging a top side of said at least one output current pad residing on said top surface of said substrate, and engaging said bottom surface of said substrate;

at least one conductive clip being coupled to said top side of said at least one input power pad to form part of a power bus.

2. The bondwireless power module of claim 1, wherein said input prongs of said at least one press-fit input power clamp comprise at least one top prong and at least one bottom prong.

3. The bondwireless power module of claim 1, wherein said input prongs of said at least one press-fit input power clamp comprise two top prongs and a bottom prong.

4. The bondwireless power module of claim 1, wherein said input prongs of said at least one press-fit input power clamp comprise at least one top prong and at least one bottom prong, said at least one bottom prong pressing said input power pad into said at least one top prong.

5. The bondwireless power module of claim 1, wherein said input prongs of said at least one press-fit input power clamp comprise at least one top prong and at least one bottom prong, wherein said at least one top prong and said at least one bottom prong each include at least one downward bend and at least one upward bend.

6. The bondwireless power module of claim 1, wherein said bottom surface of said substrate is electrically isolated from said input power pad.

7. The bondwireless power module of claim 1, wherein said at least one press-fit input power clamp comprises copper.

8. The bondwireless power module of claim 1, wherein said output current pad comprises a phase output pad of a motor drive inverter.

9. The bondwireless power module of claim 1, wherein said output current pad is coupled to a high side device and a low side device, said high and low side devices being connected in a half-bridge.

10. The bondwireless power module of claim 1 wherein said power bus is formed between said at least one input power pad and another at least one input power pad.

11. The bondwireless power module of claim 10 comprising another at least one press-fit input power clamp engaging said top side of said another at least one input power pad, and engaging said bottom surface of said substrate.

12. The bondwireless power module of claim 1, wherein said output current pad is coupling an emitter/anode node of a high side device to a collector/cathode node of a low side device.

13. The bondwireless power module of claim 1, wherein said substrate comprises a direct bond copper (DBC) substrate and said at least one input power pad and said at least one output current pad each comprise conductive traces of said DBC substrate.

14. The bondwireless power module of claim 1, wherein said module is a three-phase inverter module.

15. A bondwireless power module residing on a top surface of a substrate, said module comprising:

at least one input power pad providing power to said module;

at least one output current pad providing output current from said module;

at least one press-fit input power clamp engaging a top side of said at least one input power pad, and engaging a bottom surface of said substrate, said at least one press-fit input power clamp providing electrical connection to a first external circuit;

at least one press-fit output current clamp comprising output prongs engaging a top side of said at least one output current pad, and engaging said bottom surface of said substrate, such that said substrate is situated between said output prongs, said at least one press-fit output current clamp providing electrical connection to a second external circuit.

16. The bondwireless power module of claim 15, wherein said at least one press-fit input power clamp comprises at least one top prong and at least one bottom prong.

17. The bondwireless power module of claim 15, wherein said at least one press-fit input power clamp comprises two top prongs and a bottom prong.

18. The bondwireless power module of claim 15, wherein said at least one press-fit input power clamp comprises at least one top prong and at least one bottom prong, said at least one bottom prong pressing said substrate into said at least one input power pad.

19. The bondwireless power module of claim 15, wherein said bottom surface of said substrate is electrically isolated from said input power pad.

20. The bondwireless power module of claim 15, wherein said at least one press-fit input power clamp comprises copper.

* * * * *